United States Patent [19]
Missman et al.

[11] 3,912,001
[45] Oct. 14, 1975

[54] WATER COOLED HEAT SINK ASSEMBLY

[75] Inventors: Robert C. Missman; Carter Sinclair, both of Waynesboro, Va.

[73] Assignee: General Electric Company, Salem, Va.

[22] Filed: Mar. 11, 1974

[21] Appl. No.: 449,742

[52] U.S. Cl. .................... 165/80; 317/100; 357/82
[51] Int. Cl.$^{2}$ .................... F28F 7/00; H02B 1/00
[58] Field of Search .......... 165/80; 317/100; 357/82

[56] References Cited

UNITED STATES PATENTS

| | | | |
|---|---|---|---|
| 3,255,813 | 6/1966 | Besson | 165/80 |
| 3,536,133 | 10/1970 | Mattsson | 317/100 |
| 3,653,433 | 4/1972 | Scharli | 165/80 |
| 3,703,668 | 11/1972 | Bylund | 165/80 |
| 3,743,893 | 7/1973 | Yamomoto | 165/80 |

OTHER PUBLICATIONS

IBM, Technical Disclosure Bulletin, Vol. 13, No. 2, p. 442, July 1970; Dombrowskas and Patch.

*Primary Examiner*—Albert W. Davis, Jr.
*Assistant Examiner*—Daniel J. O'Connor
*Attorney, Agent, or Firm*—Arnold E. Renner

[57] ABSTRACT

A fluid cooled heat sink assembly including a plurality of individual members between pairs of which is disposed a source of heat; e.g. a semiconductor device, in which each of the members is provided with a reduced central portion serving to define a contact surface for the heat source and larger end portions for connection to the cooling fluid system. To facilitate the connection of the fluid system and to maintain appropriate electrical spacing between the members while retaining compactness of total structure, adjacent ones of the members are positioned such that corresponding major axes of the members are disposed in a skew line relationship.

13 Claims, 3 Drawing Figures

WATER COOLED HEAT SINK ASSEMBLY

BACKGROUND OF THE INVENTION

The present invention relates generally to fluid cooled heat sinks and more particularly to heat sink assemblies adapted to the cooling of semiconductor devices enclosed within substantially disc shaped housings, although it is obvious that the heat source could be of other types.

In the electrical power field there are many applications for thyristors such as silicon controlled rectifiers and diodes which in use generate significant amounts of heat and which must be cooled in order to retain their operating capacities, especially inasmuch as heat is one of the major causes of failure of semiconductor devices. To provide adequate cooling, it has long been known to provide for the circulation of a fluid within heat sinks to enhance the heat transfer properties. In the semiconductor field, because the heat sink often forms an electrical connection to the semiconductor as well as providing for heat dissipation, the fluid utilized is often a nonconductive fluid such as deionized water.

In the past few years the packaging of semiconductor devices has undergone modification and one such modification is the placement of a semiconductor device into a substantially disc shaped package having an electrical terminal in the form of a flat surface at each end of the disc. Such semiconductor devices possess the advantage of having two short, thermally parallel, paths for the heat to escape. This gives a small overall height thus permitting a more compact overall arrangement. This advantage is not without its problems, however, in that this same compactness tends to put two heat sink members of differing electrical potential in close proximity to one another. Thus, there exists the problem of electrical isolation.

Fluid cooled heat sinks (other than finned, air cooled structures) normally provide for one or more conduits which extend through the heat sink itself for the conduction of the cooling fluid. To maximize cooling it is desirable to locate the cooling conduit in close proximity to the surface at which the heat is generated. Thus, it is known to use a plurality of passages of smaller cross-sectional area rather than one large one. It is also known that certain advantages are to be derived by machining the heat sink out of a block of high thermal conductivity material such as aluminum or copper rather than by fabrication by other means such as brazing or casting. Castings sometimes create problems in that sand inclusions tend to provide weakened areas or perhaps even leaks. In the brazing situation it is quite difficult to obtain a water tight braze and the flux utilized in the process often results in what is known in the art as "stringers" which may be subsequently washed away with a resultant leak.

Recognizing the advantage of a machined heat sink, it will be immediately obvious that the single most easily fabricated configuration by machining is the circle, particularly with respect to the fluid carrying conduit. The circular configuration is also desirable from a coupling standpoint so as to permit the use of common connection means such as threaded joints, O-rings, etc. for connection to the system supplying fluid to the heat sink. From a space standpoint, however, the circular connection is not economical for the common connection of a plurality of in-line conduits or fluid passages and can create problems in achieving the desired short heat path between the heat source and the passages.

SUMMARY OF THE INVENTION

It is, therefore, an object of the present invention to provide an improved heat sink assembly.

It is a further object to provide an improved fluid cooled heat sink assembly employing plural similar members for retaining a heat source therebetween.

It is a further object to provide a fluid cooled heat sink assembly of minimum size while retaining suitable electrical isolation and ease of making fluid connections.

It is still a further object to provide a fluid cooled heat sink assembly the members of which may be readily machined from a single piece of material to thereby minimize the possibility of fluid leakage.

The foregoing and other objects are satisfied in accordance with the present invention through the provision of a heat sink assembly having a plurality of individual members each of which is preferably machined from a single block of material exhibiting good thermal conductivity. Each of the members has a reduced central portion defining a contact surface for the heat source. A plurality of conduits or bores for the transmission of a cooling fluid extend the length of each of the members along a major axis thereof and in close proximity to the contact surface. Enlarged end portions of the assembly are provided for suitable connection to allow termination of the conduits at a common manifold and to further provide adequate space for the connection to a suitable source of fluid. Adjacent members of the heat sink assembly are disposed with a major axis of each in a skew line relationship so that suitable electrical spacing is provided when the heat sink assembly members must also form a part of an electrical circuit. Disposed intermediate a pair of such members is the heat source itself and the assembly may be held together by any suitable retaining means.

BRIEF DESCRIPTION OF THE DRAWINGS

While the present invention is particularly defined in the claims annexed to and forming a part of this specification, a better understanding may be had from the following description taken in conjunction with the accompanying drawings in which:

DETAILED DESCRIPTION

Figure 1:
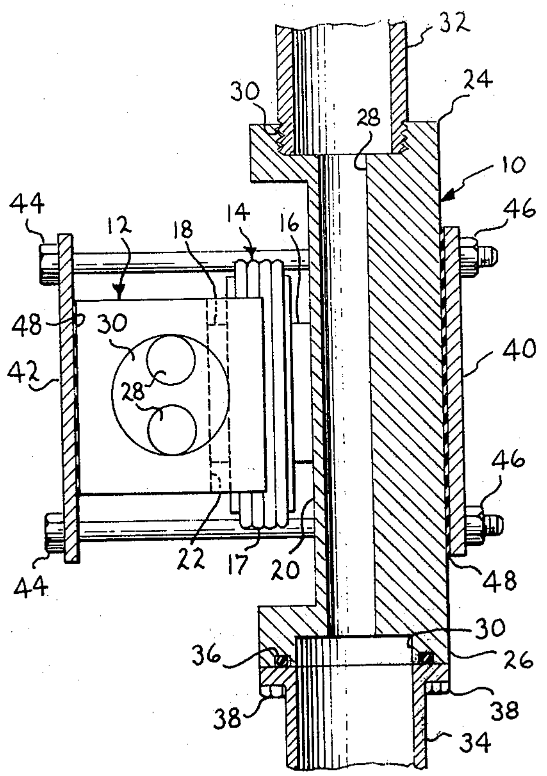
FIG. 1 is an elevational view, partially in section, illustrating the present invention in a first embodiment.

Referencing now FIG. 1 there is shown the heat sink assembly of the present invention in its first embodiment. Included are two members indicated generally at 10 and 12 which are of identical configuration and which are preferably machined from a single block of material exhibiting good heat transfer characteristics such as aluminum or copper. As best seen by the right hand member 10, members 10 and 12 are of a generally elongated configuration and, in the assembly, the members 10 and 12 are positioned with respect to one another with their corresponding major axes disposed in a skew line relationship (illustrated at approximately 90°). Disposed between the two members 10 and 12 is a heat source which does not form a part of the present invention but which is illustrated as a power semiconductor device 14 of general disc shaped configuration. The semiconductor device 14 includes a pair of end contact portions 16 and 18 separated by a central portion 17 which is normally of insulating material. The contact portions 16 and 18 form thermal contact with each of the members 10 and 12 and in this illustrated case of a semiconductor device may also form electrical connections.

As best illustrated by the right hand member 10, the configuration of the members is generally C-shaped to provide a center portion of reduced cross-sectional area to define a contact surface 20. A like surface 22 is similarly defined on member 12. The contact surfaces 20 and 22 are those which contact the terminal portions 16 and 18, respectively, of the semiconductor device 14. As is best seen at the right hand member 10, there are provided enlarged end portions 24 and 26 to which suitable fluid connections may be made as will be explained hereinafter.

At least one conduit or bore, preferably two smaller bores 28 as best shown by a left hand member 12, are provided extending through the length of the members 10 and 12 for the passage therethrough of coolant fluid. As is clearly illustrated by member 12, the bores 28 are disposed having their central axes disposed in substantially the same plane, which plane lies parallel to the plane of the contact surface 22. By providing plural bores or conduits a shorter heat path is provided between the surface (e.g. 22) and the coolant fluid than would be the case were a single bore of larger dimension provided. Each of the bores 28 terminates, as is seen with respect to both members 10 and 12, in an enlarged annular recess 30 forming a common manifold. The provision of a common termination allows ease of providing the coolant fluid from a source (not shown) to each of the cooling passages or bores 28.

Suitable connections are made to provide fluid and two such examples are illustrated in FIG. 1. At the top of FIG. 1 there is shown that the annular recess 30 is provided on its sidewalls with screw threads into which an appropriately threaded pipe illustrated at 32 may be disposed such that fluid may be supplied from the source through the bores 28. At the bottom of FIG. 1 a second type of connection is shown. This is a typical O-ring type of structure in which an O-ring 36 is disposed within a suitable groove formed in the end wall of the enlarged portion 26 adjacent the annular recess 30 and a flanged fitting 34 is secured to the member by suitable means such as a plurality of bolts 38 which fit into tapped holes within the member.

Figure 2:
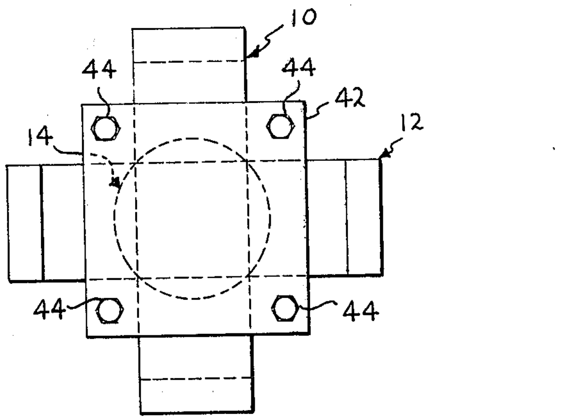
FIG. 2 is a plan view, supplementing FIG. 1, illustrating one possible method of retaining together the assembly of the present invention; and, FIG. 3 is an elevational view, partially in section, illustrating the present invention in a second embodiment.

The assembly of the two members 10 and 12 and the heat source 14 are clamped together in thermal and, if desired, electrical contact by a suitable clamping means. In FIGS. 1 and 2 this clamping means is shown as a pair of plates 40 and 42 which respectively abut the backsides of the members 10 and 12. The plates and hence the assembly are secured by a plurality of bolt and nut assemblies 44, 46 with an appropriate amount of pressure determined by the degree to which the nut and bolt assemblies are tightened. If desired to provide electrical insulation between the two members 10 and 12, suitable insulating layers shown at 48 may be provided between the plates 40 and 42 and respective members 10 and 12. Alternatively, plates 40, 42 may be made of insulating material so that a separate layer of insulation would not be necessary. Thus it is seen that by the above structure the fluid carrying bores or conduits may be located close to the contact surface 20 or 22 to maintain a short thermal path between the source of heat and the cooling fluid. By positioning the two members such that their corresponding major axes are disposed in a skew line relationship, and by providing the reduced center portion, it is seen that a compact structure is achieved in which there is a substantial electrical spacing between end portions so that these members may serve not only as heat sinks but as a portion of the electrical circuit as well. This configuration further facilitates access for the making of the fluid connections.

Figure 3:
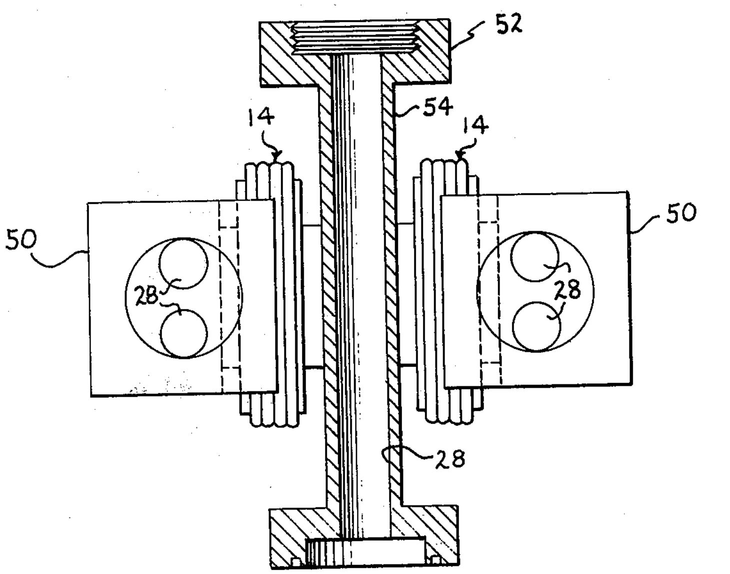

FIG. 3 represents a second embodiment of the present invention in which more than one heat source such as a semiconductor device 14 is provided in a "stacked" relationship. As shown in FIG. 3 the heat sink assembly of this embodiment employs three members; two end members 50 which may be identical to members 10 and 12 as shown with respect to FIG. 1 and a central member 52 which is of substantial I-shaped configuration. As illustrated, member 52 has two contact surfaces 54 against each of which is disposed a heat source. Suitable clamping means such as shown in FIGS. 1 and 2 again may be utilized to retain the assembly in a fixed position. As is apparent from the drawing, members 50 and 52 may all be made of the same size block of material, the difference being that the member 52 is provided with a recessed portion on both sides thereof so that the cooling bore is in close proximity to both contact surfaces 54. As is further obvious from the drawing, the inclusion of a greater number of heat sources within a stack merely requires the addition of additional members such as 52 with each member of the heat conducting assembly being located with its major axis transverse to that of the members adjacent thereto.

Thus it is seen that there has been provided a heat sink which presents a short thermal path for thermal relationships, provides for adequate electrical isolation between adjoining members and readily lends itself to the application of fluid connections.

While there have been shown and described what are at present considered to be the preferred embodiments of the present invention, modifications thereto will readily occur to those skilled in the art. It is not desired, therefore, that the invention be limited to the specific arrangements shown and described and it is intended to cover in the appended claims all such modifications as fall within the true spirit and scope of the invention.

What is claimed is:

1. A fluid cooled heat sink assembly for use with a heat source comprising:

a. at least two members, of a material exhibiting good thermal conductivity, adapted to retain the heat source therebetween, each of said members having,
   1. at least one conduit extending substantially parallel to a major axis thereof for the passage of a cooling fluid therethrough, and
   2. a central portion of reduced cross-sectional area with respect to each of two end portions, said central portion defining a contact surface for the heat source;

b. said members being positioned such that corresponding major axes of respective members are disposed in a skew line relationship; and, c. retaining means for securing said assembly.

2. The invention in accordance with claim 1 wherein each of said members is of a generally C-shaped configuration.

3. The invention in accordance with claim 1 wherein each of said members has at least two conduits.

4. The invention in accordance with claim 3 wherein the axis of each conduit of a member lies in substantially the same plane which plane is substantially parallel to the plane of the contact surface of that member.

5. The invention in accordance with claim 4 wherein said conduits terminate in a common recess located in the end portion which recess is adapted for connection to a source of cooling fluid.

6. The invention in accordance with claim 1 wherein said two members are disposed at right angles with respect to one another.

7. The invention in accordance with claim 1 wherein the heat sources are semiconductor devices and the material of said members also exhibits good electrical conductivity.

8. A fluid cooled heat sink assembly for use with a plurality of heat sources comprising:

a. at least three members of material exhibiting good thermal conductivity adapted to retain a heat source between each two adjacent members, each of said members having, 1. at least one conduit extending substantially parallel to a major axis thereof for the passage of a cooling fluid therethrough, and
2. a central portion of reduced cross-sectional area with respect to each of two end portions said central portion defining a contact surface for a heat source;

b. said members being positioned such that corresponding major axes of adjacent members are disposed in a skew line relationship; and, c. retaining means for securing said members together.

9. The invention in accordance with claim 8 wherein each end member is substantially C-shaped and any intermediate member is of a substantially I-shaped configuration.

10. The invention in accordance with claim 8 wherein each member has at least two conduits.

11. The invention in accordance with claim 10 wherein the axis of each conduit of a member lies in substantially the same plane which plane is substantially parallel to the plane of the supporting surface of that member.

12. The invention in accordance with claim 11 wherein said conduits terminate in a common recess located in the end portion which recess is adapted for connection to a source of cooling fluid.

13. The invention in accordance with claim 8 wherein the heat sources are semiconductor devices and the material of said members also exhibits good electrical conductivity.

* * * * *